United States Patent
Mraz et al.

(10) Patent No.: US 7,330,029 B2
(45) Date of Patent: Feb. 12, 2008

(54) CRYOSTAT CONFIGURATION WITH THERMALLY COMPENSATED CENTERING

(75) Inventors: Beat Mraz, Bubikon (CH); Johannes Boesel, Neuheim (CH)

(73) Assignee: Bruker Biospin AG, Faellanden (CH)

( * ) Notice: Subject to any disclaimer, the term of this patent is extended or adjusted under 35 U.S.C. 154(b) by 172 days.

(21) Appl. No.: 11/352,319

(22) Filed: Feb. 13, 2006

(65) Prior Publication Data

US 2007/0007962 A1 Jan. 11, 2007

(30) Foreign Application Priority Data

Mar. 24, 2005 (DE) .................. 10 2005 013 620

(51) Int. Cl.
*G01V 3/00* (2006.01)
*F25D 21/06* (2006.01)
(52) U.S. Cl. .................. 324/318; 62/51.1; 62/54.1
(58) Field of Classification Search ........ 324/300–322; 62/51.1, 54.1, 2.1
See application file for complete search history.

(56) References Cited

U.S. PATENT DOCUMENTS

| 5,522,226 | A | * | 6/1996 | Mruzek ...................... 62/51.1 |
| 5,744,959 | A | | 4/1998 | Jeker |
| 6,169,404 | B1 | * | 1/2001 | Eckels .......................... 324/320 |
| 6,204,665 | B1 | * | 3/2001 | Triebe et al. ................ 324/318 |
| 6,389,821 | B2 | | 5/2002 | Strobel |
| 6,833,701 | B2 | * | 12/2004 | Marek ......................... 324/307 |
| 2002/0002830 | A1 | | 1/2002 | Strobel |
| 2004/0144101 | A1 | | 7/2004 | Hofmann |

FOREIGN PATENT DOCUMENTS

GB  2 015 716  9/1979

OTHER PUBLICATIONS

Dirk D. Laukien and Werner H. Tschopp "Superconducting NMR Magnet Design", Concepts in Magnetic Resonance, 1993, 6, 255-273.

* cited by examiner

*Primary Examiner*—Brij Shrivastav
*Assistant Examiner*—Dixomara Vargas
(74) *Attorney, Agent, or Firm*—Paul Vincent

(57) ABSTRACT

A cryostat configuration has at least three centering elements (4) which are distributed about the periphery of a cryocontainer (1). Each end (6) of the centering elements (4) facing away from an outer jacket (3) of the cryostat configuration is connected to an actuator (7) which exerts a pressure or tensile force on the respective centering element (4) to generate a mechanical tension in a corresponding centering element (4) which loads the centering elements (4) with a nearly constant pressure or tension, irrespective of the temperature changes within the cryostat configuration. This yields a cryostat configuration which permits pressure centering without overloading the centering elements.

27 Claims, 5 Drawing Sheets

CRYOSTAT CONFIGURATION WITH THERMALLY COMPENSATED CENTERING

This application claims Paris Convention priority of DE 10 2005 013 620.6 filed Mar. 24, 2005 the complete disclosure of which is hereby incorporated by reference.

BACKGROUND OF THE INVENTION

The invention relates to a cryostat configuration for keeping cryogenic fluids in at least one cryocontainer which is suspended from thermally insulating suspension tubes and/or suspension devices which are connected to an outer jacket of the cryostat configuration, wherein the at least one cryocontainer is subjected to thermal effects and is centered relative to a surrounding container, preferably the outer jacket, using at least three centering elements which are distributed about the periphery of the cryocontainer, wherein one end of each centering element abuts or is mounted to a surrounding container.

A cryostat configuration of this type for a superconducting magnet system of a nuclear magnetic resonance (NMR) measuring means is disclosed e.g. in GB 2 015 716 A and in the document "Superconducting NMR Magnet Design" (Concepts in Magnetic Resonance, 1993, 6, 255-273). The superconducting magnet coil system is disposed in a first cryocontainer with cryogenic liquid, usually liquid helium, which is surrounded by radiation shields, superinsulating sheets and one further optional cryocontainer having cryogenic liquid, usually liquid nitrogen. The liquid containers, radiation shields and superinsulating sheets are housed in an external container which delimits a vacuum space (outer vacuum shell, outer jacket). The superconducting magnet is cooled and kept at a constant temperature by the evaporating helium surrounding it. The elements surrounding the helium container thermally insulate the helium container to minimize the heat input into the helium container and minimize the evaporation rate of the helium.

Magnet systems for high-resolution NMR spectroscopy are generally so-called vertical systems, wherein the opening for receiving the NMR sample to be examined and the homogeneous region of the magnetic field lines extend in a vertical direction. Each of the nested cryocontainers and the outer jacket have an inner tube. The helium container is usually connected to the outer vacuum shell via at least two thin-walled suspension tubes. The cryocontainer is thereby mechanically fixed and the suspension tubes provide access to the magnet, as is required e.g. for cooling and charging. To prevent contact between different cryocontainers at different temperature levels (and thereby prevent heat bridges and increased cryogenic loss), the cryocontainers are radially supported by centering elements which are pressure or tension-loaded. These comprise thin bars of maximum possible length made from a material having poor thermally conducting properties and are e.g. rigidly connected to the helium container but contact the nitrogen container only at points. In this case, the nitrogen container is again connected to the outer vacuum shell via similar centering elements and is thereby centered. Pressure-loaded centerings are conventionally used for smaller rotationally symmetric, vertical cryostats. Compared to tension-loaded centerings, these have i.a. the advantage that no additional fixed anchoring on the second cryocontainer or the outer vacuum shell is required. This simplifies the construction.

The cryocontainers contract to a greater or lesser extent during cooling (depending on their final operating temperature), whereas the outer vacuum shell remains at room temperature and maintains its size. The position of the containers relative to each other and relative to the outer jacket can thereby change. Two containers could come into contact with another, in the present case most likely in the region of their inner tubes. This would disadvantageously lead to heat bridges and an increase in cryogenic losses. This is prevented through use of the centering elements. Since the centering elements generally also contract during cooling and since mutual adjustment of the containers is not possible in the cold state, the elements must be pretensioned in the warm state (for pressure centering), or the elements are loaded to a greater extent after cooling than in the warm state (for tension centering). This different, poorly defined tension state must be taken into consideration in the design of the elements.

These problems are aggravated when, in addition to the suspension tubes, asymmetrically disposed vertical openings (neck tubes) are required between the helium container or nitrogen container and the outer vacuum shell, as e.g. in vertical cryostats, when a cryocooler is used for recondensation of evaporating cryogens. In this case, the above-mentioned neck tube connects the outer vacuum shell of the cryostat to the cryocontainer (see e.g. US2002/0002830 for a helium container). When these openings are elastic in a vertical direction (e.g. a corrugated bellows), the forces generated by evacuation of the space between the outer vacuum shell and the components within the cryostat produce a torque that acts on the container. This torque must already be compensated for in the warm state by the centerings at the lower and upper edges of the cryocontainers. To also ensure centering of the containers in the cold state, the centering elements on one side of the container must be pretensioned even more in the warm state (pressure centering) or have an even greater tension in the cold state (tension centering) compared to containers without asymmetric opening. The eccentric pretension can cause the containers to contact each other, mainly in the region of the inner tubes. This increases the cryogenic loss during cooling and sometimes even results in a vacuum breakdown when O-rings freeze and loose their sealing properties.

It is therefore the underlying purpose of the present invention to propose a cryostat configuration, with which centering elements are inserted between the container to be centered and a surrounding container, preferably the outer vacuum shell, in such a manner that the containers are always centered relative to each other and the centering elements are not overloaded in any operating state.

It is therefore the underlying purpose of the present invention to propose a cryostat configuration which permits pressure centering even after cooling of the cryocontainers without overloading the centering elements in such a manner that the different cryocontainers or the cryocontainer and outer jacket do not contact each other.

SUMMARY OF THE INVENTION

This object is achieved in accordance with the invention in that in at least one of the cryocontainers, each end of the centering elements facing away from the outer jacket is connected to an actuator which exerts a pressure or tensile force on the respective centering element, and which is mounted to the cryocontainer at at least one contact point, wherein, through fixation of the actuator to the cryocontainer at the contact point, through thermal changes in size of the cryocontainer, through thermal changes in the size of individual components of the actuator, and optionally through mechanical translation, a mechanical tension is generated in the corresponding centering elements such that the centering elements remain loaded with a nearly constant pressure or tension, preferably in the range of ±10% of the pressure or tension prevailing at room temperature and irrespective of the temperatures within the cryostat configuration.

Decisive in this case is the interaction between the thermal changes of the cryocontainer which are generally noticeable in the form of contractions, and the thermal change in length of the actuator component which is connected to the cryocontainer at at least one suitable contact point. The motion of the cryocontainer resulting from the change in size is transferred to the actuator via the contact point/s. The increase in distance, resulting from cryocontainer contraction, between the contact points of the actuator on the cryocontainer and the surrounding container, preferably the outer jacket, relative to which the cryocontainer is to be centered, is compensated for by a change in length of the actuator components. This is done through geometrical combination of materials with different thermal expansion coefficients and/or different dimensions in such a manner that the position of the connecting point between the actuator and the centering element, relative to the surrounding container (outer jacket) changes only slightly or not at all. In this fashion, the centering elements always experience approximately the same pressure or tension irrespective of the instantaneous temperature such that the centering elements always have a similar and clearly defined tension state, wherein the cryocontainer remains in its central position.

Centering of the containers in the warm state is simplified and the containers do not contact each other at any time during cooling. The inventive pressure centerings of simple construction can then also be used for each type of container.

The advantages of the invention can be utilized with particular effectivity when the cryocontainer comprises an additional asymmetric outward opening. The additional torque on the cryocontainer generated by the above-described evacuation of the space between the outer vacuum shell and the installations of the cryostat due to the asymmetric opening can be compensated for by the inventive cryostat configuration, even in the cold state and without additional load.

In one special embodiment of the inventive cryostat configuration, at least one of the centering elements is in thermal contact with a further cryocontainer or with a radiation shield which is located between the cryocontainer to be centered and the container which is disposed further outside, preferably the outer jacket, via a flexible connecting element with good thermal conducting properties. The heat input, e.g. from the outer jacket to the cryocontainer can be reduced in this fashion.

In one preferred embodiment of the inventive cryostat configuration, the centering elements are produced from a fiber glass reinforced plastic material or from a material having similar thermal and mechanical properties. The centering elements must, in particular, have low thermal conducting properties, a high pressure or tension resistance and high bending elasticity to prevent unnecessary heat input e.g. from the external container and to withstand the pressure and tension load exerted on the centering elements.

The centering elements are each preferably formed as tubes or rods having an arbitrary, in particular variable, cross-section. To minimize the heat input into the cryocontainer, the centering elements preferably have a minimum thickness.

In one particularly preferred embodiment of the inventive cryostat configuration, the actuator comprises a first and a second component, wherein the components are produced from materials having different thermal expansion coefficients. In case of a temperature change in both components, the lengths will generally change differently with the result that the components can move relative to each other. The materials of the components are selected, in particular with regard to their longitudinal length coefficients of thermal expansion, in dependence on the design of the actuator and the overall geometric configuration of the individual elements of the cryostat configuration. It is also feasible to produce the components from the same material but with different lengths, which yields different absolute length changes during cooling.

The first component of the actuator is preferably produced from a material having a thermal expansion coefficient which is smaller than or equal to zero. During cooling, the length of the component does not change or it even expands.

The first component of the actuator may also be produced from a material having a positive thermal expansion coefficient whose value is selected such that, when the temperature changes, the absolute change in length of the first component is less than the absolute change in length of the second component, preferably at most one fifth of the absolute length change of the second component. The lengths of the components still differ to a sufficient degree to compensate for the variation in distance between the cryocontainer and the container relative to which the cryocontainer is to be centered. The relevant temperature range extends from room temperature to the temperature of the cryogenic fluid kept in the cryocontainer, e.g. down to approximately 4K for liquid helium.

The first component of the actuator is preferably designed as a tube or rod with arbitrary, in particular, changing cross-section.

With particular preference, the second component of the actuator is produced from a material having a large positive thermal expansion coefficient, in particular, copper, brass, aluminium, or a material having similar thermal and mechanical properties. The second component is consequently greatly shortened during cooling.

The second component of the actuator is preferably designed as a tube or channel which is closed on one side.

In a particularly preferred embodiment, the first component of the actuator is disposed, in particular coaxially, within the second component of the actuator which is designed as a tube or channel.

In one preferred further development of this embodiment, the first component of the actuator is displaceably connected to the second component of the actuator which is designed as a tube or channel, at the closed tube end of the second component via an axial screw connection in such a manner that the first component can be displaced relative to the second component in the direction of the tube axis. Since the two elements are connected, a change in length or displacement of one element has an effect on the other. Moreover, the screw connection already permits pretensioning of the elements in the warm state, relative to the outer container preferably the outer jacket.

A guiding sleeve is advantageously mounted around the first component of the actuator, which is solidly supported on the first component and whose outer diameter is large enough to leave play between the guiding sleeve and the second component. This prevents excessive bending of the first component or an excessive bending load at the connecting point of the two components when the first component is displaced relative to the second component in the direction of the centering element axis. The guiding sleeve may also be rigidly connected to the inner side of the second component.

In one preferred embodiment of the invention, the second component of the actuator is designed as a tube or channel and is rigidly connected, at or close to its open tube end, to a contact point of the cryocontainer that is to be centered relative to the surrounding container and preferably proximate the outer edge of the cryocontainer. The end of the second component of the actuator which is not connected to the cryocontainer to be centered is then closer to the axis of the cryocontainer than the contact point. The temperature driven change in length of the components causes the end of the first component which is not connected to the second component to move relative to the container with respect to which centering is performed, i.e. opposite to the motion caused by the temperature change of the cryocontainer to be centered. In this fashion, distance changes between the cryocontainer and the container relative to which centering is performed can be compensated for.

To transfer this motion to the centering element, the first component of the actuator is rigidly connected to the centering element at its end that is not connected to the second component.

In order to transmit the motion of the components to the centering element, the actuator may advantageously have an additional mechanical translating element, in particular a lever, a gearwheel or an eccentric cam, which is rigidly connected to the cryocontainer to be centered at a contact point close to the outer edge of the cryocontainer, and which contacts the first component either indirectly via a further rod or directly at the end of the first component which is not connected to the second component.

In a particularly preferred embodiment of the inventive cryostat configuration, the end of the first component of the actuator which is in direct or indirect contact with the mechanical translating element, is moved in a defined manner relative to the translating element, wherein the translating element translates this relative motion to the centering element in such a manner that the mechanical tension state of the centering element is nearly independent of the instantaneous temperatures within the cryostat configuration. The centering elements are thereby always loaded with a nearly constant pressure or tension, preferably in a range of ±10% of the pressure or tension prevailing at room temperature.

In one alternative embodiment, the actuator comprises a tube or a rod with any, in particular, variable cross-section, whose thermal expansion coefficient is smaller or larger than that of the cryocontainer to be centered, and a mechanical translating element, in particular, a lever, a gearwheel or an eccentric cam. The thermal expansion coefficient is different from that of the cryocontainer and produces a thermal behavior of the tube or rod which differs from that of the cryocontainer and which counteracts the motion of the cryocontainer during temperature changes.

The actuator mechanical translating element is preferably rigidly connected to the cryocontainer to be centered at a contact point in the vicinity of the outer edge of the cryocontainer.

In order to ensure optimum cooperation between the thermal effects of the cryocontainer and the tube or rod of the actuator, one end of the actuator tube or rod is rigidly connected to the cryocontainer to be centered via a connecting location at a contact point close to the cryocontainer axis. The thermal effects of the cryocontainer are compensated for by the actuator in combination with the mechanical translating element such that the centering element is loaded with a nearly constant pressure or tension.

In one advantageous embodiment, the actuator tube or rod can be axially displaced via an axial screw connection at an end which is connected to the cryocontainer at the contact point, and is guided in the direction of the tube axis via a guiding device rigidly connected to the cryocontainer in the vicinity of its other end, opposite to the screw connection. The tube or rod of the actuator and the centering element may be pretensioned in this manner without laterally deflecting or bending the actuator tube or rod.

In the optimum case, the other end of the tube or rod in the actuator, which is in contact with the mechanical translating element either directly or indirectly via a further rod, experiences a defined relative motion with respect to the translating element, wherein the translating element transmits this relative motion to the centering element in such a manner that its mechanical tension state is nearly independent of the instantaneous temperatures within the cryostat configuration.

The inventive configuration may be used in a particularly advantageous manner when one of the cryocontainers with cryogenic fluid contains a superconducting magnet configuration.

The invention can be used with particular preference when the superconducting magnet configuration is part of a nuclear magnetic resonance apparatus, in particular for magnetic resonance imaging (MRI) or magnetic resonance spectroscopy (NMR).

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

Figure 1A:
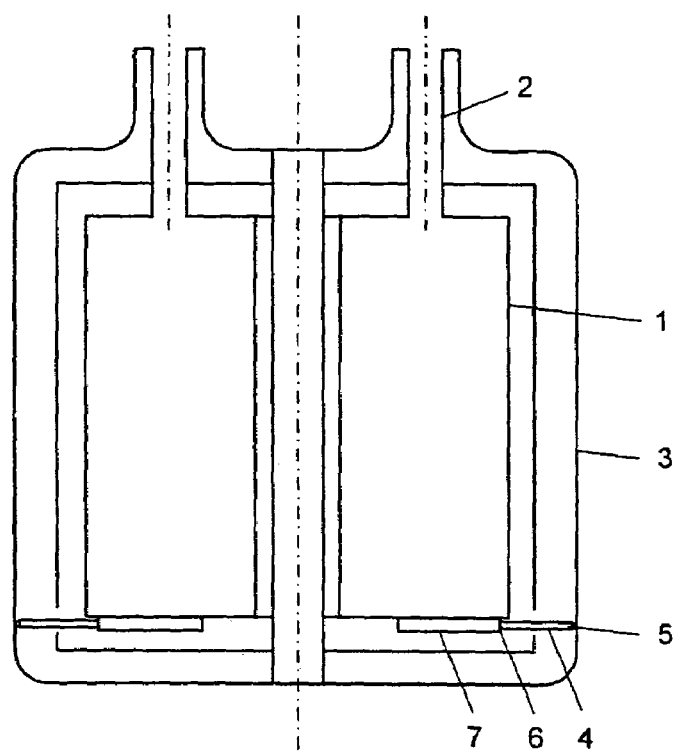
FIG. 1a shows a schematic side view of an inventive cryostat configuration for keeping a cryogenic fluid, with centering elements.
Figure 1B:
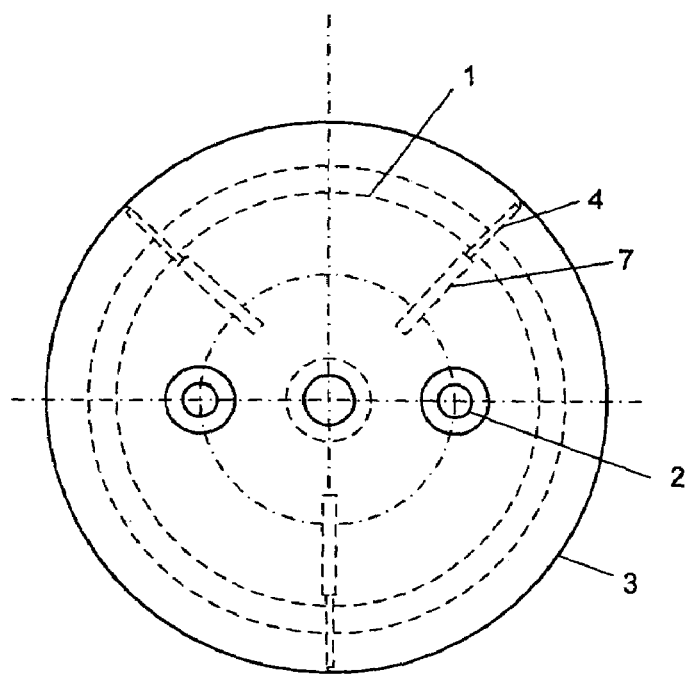
FIG. 1b shows a schematic top view of an inventive cryostat configuration for keeping a cryogenic fluid, with centering elements.

FIGS. 1a and 1b show embodiments of the inventive cryostat configuration with a cryocontainer 1 for keeping a cryogenic liquid, which is mounted to an outer jacket 3 of the cryostat configuration via suspension tubes 2. Centering devices which are connected to the cryocontainer 1 and contact the outer jacket 3 via centering elements 4 are provided at the lower end of the cryocontainer 1 in order to center the cryocontainer 1 relative to the outer jacket 3 of the cryostat configuration. The ends 5 of the centering elements 4 abut the outer jacket 3 or are mounted thereto. At the other end 6, the centering elements are connected to an actuator 7 which exerts pressure or tension onto the centering element 4.

Figure 2A:
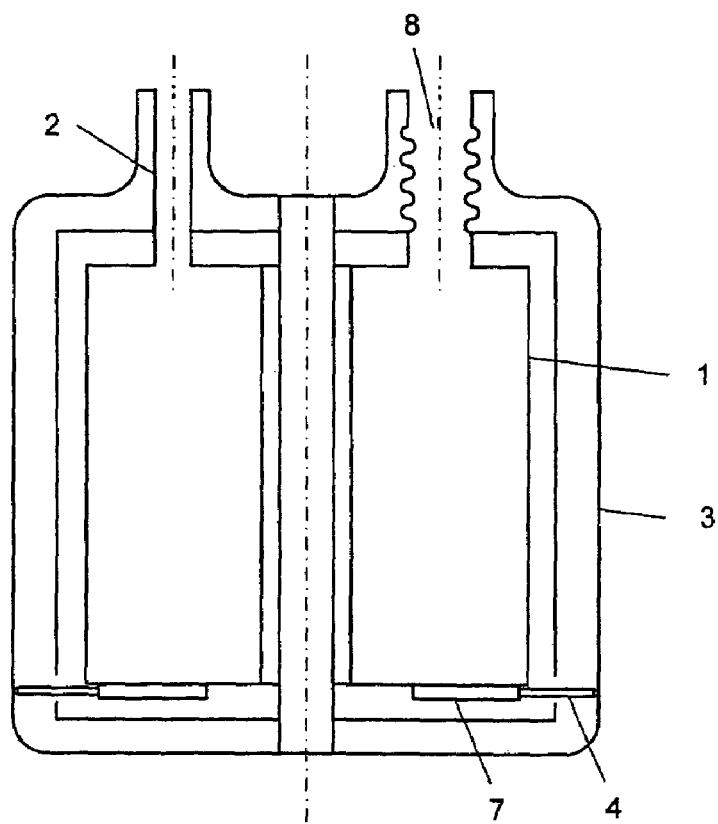
FIG. 2a shows a schematic side view of an inventive cryostat configuration with centering elements and an asymmetric opening for keeping a liquid cryogen.
Figure 2B:
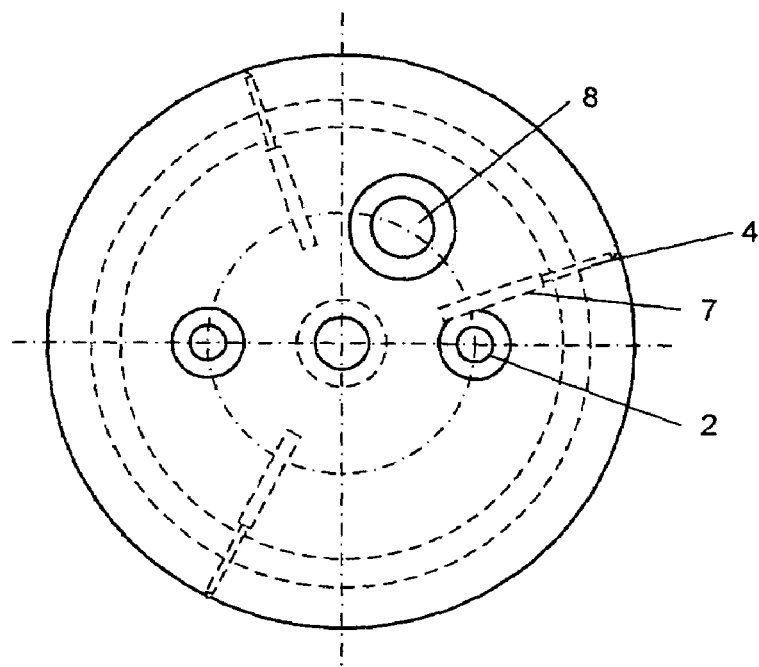
FIG. 2b shows a schematic plan view of an inventive cryostat configuration with centering elements and an asymmetric opening for keeping liquid cryogen.

FIGS. 2a and 2b show embodiments of the inventive cryostat configuration, wherein the cryocontainer 1 comprises a neck tube designed as asymmetric opening 8. This asymmetric configuration of the opening 8 is shown, in particular, in FIG. 2b.

Three centering elements 4 are preferably uniformly distributed about the periphery of the cryocontainer 1, as is shown in the plan views of FIGS. 1b and 2b. For reasons of clarity, the centering elements 4 are disposed oppositely in the side views of FIGS. 1a and 2a. The actuator 7 may be mounted to the lower or upper container lid. Further spacers, e.g. centering elements with actuator or conventional tension centerings, may additionally be used at the other container lid.

Figure 3A:
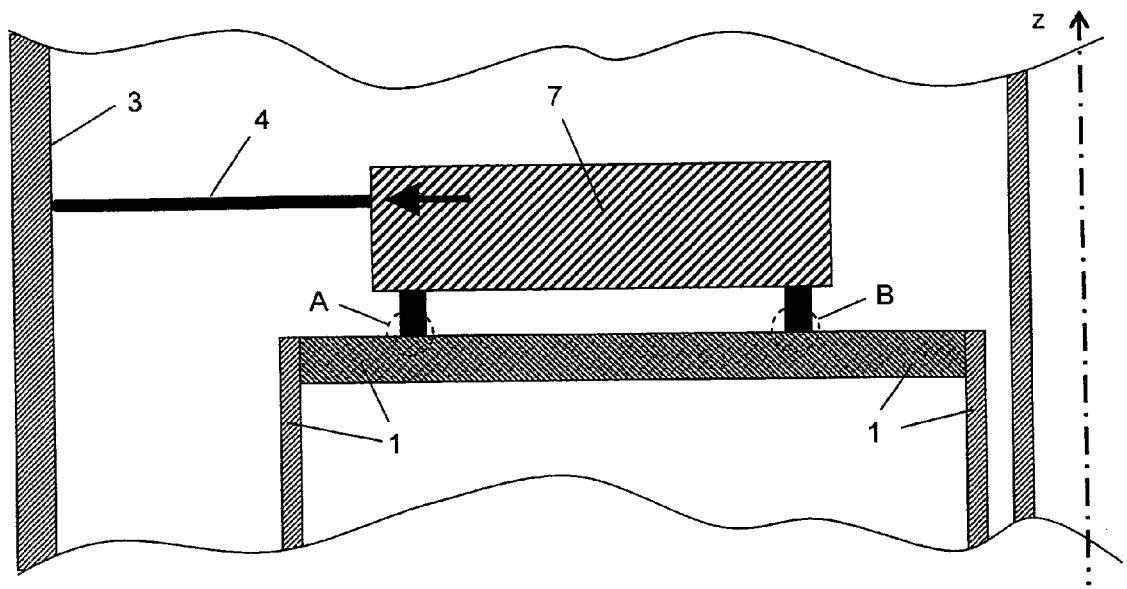
FIG. 3a shows a schematic section of an embodiment of the inventive cryostat configuration with an actuator and a centering element which is pressure-loaded.

FIG. 3a shows a schematic section of an embodiment of the inventive cryostat configuration, wherein the centering element 4 is pressure-loaded. The centering element 4 is rigidly connected to the actuator 7 and contacts the outer jacket 3. The actuator 7 is rigidly connected to the cryocontainer 1 at a contact point A, preferably close to the outer edge of the cryocontainer 1 and at a contact point B, preferably close to the axis z of the cryocontainer 1.

Figure 3B:
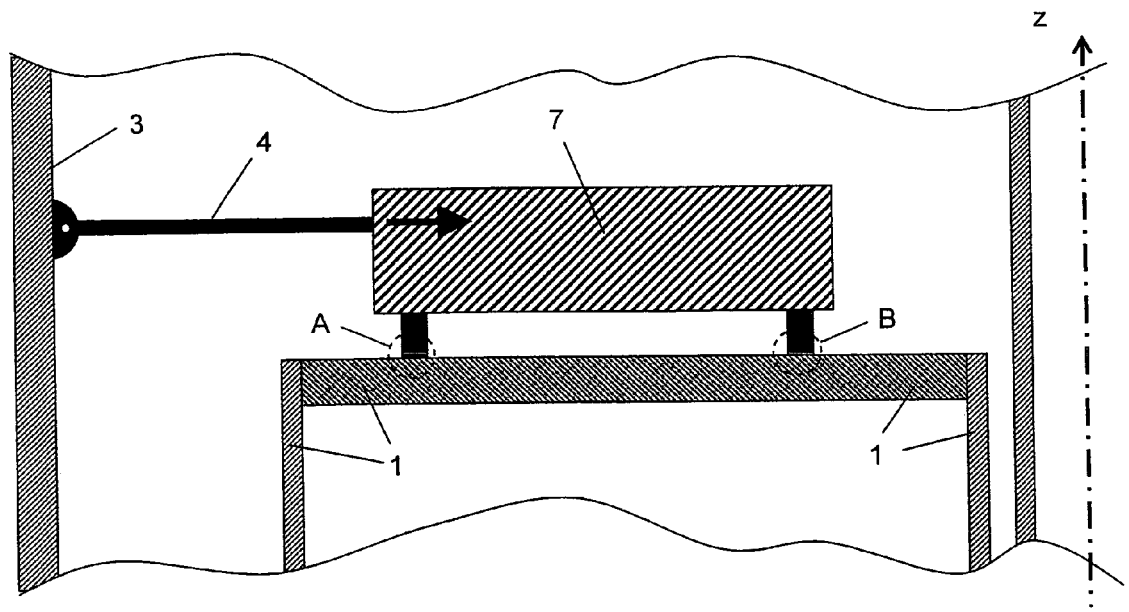
FIG. 3b shows a schematic section of an embodiment of the inventive cryostat configuration with an actuator and a centering element which is tension-loaded.

In the embodiment of FIG. 3b, the centering element 4 is tension-loaded. The centering element 4 is rigidly connected to the actuator 7 and also to the outer jacket 3.

Figure 4A:
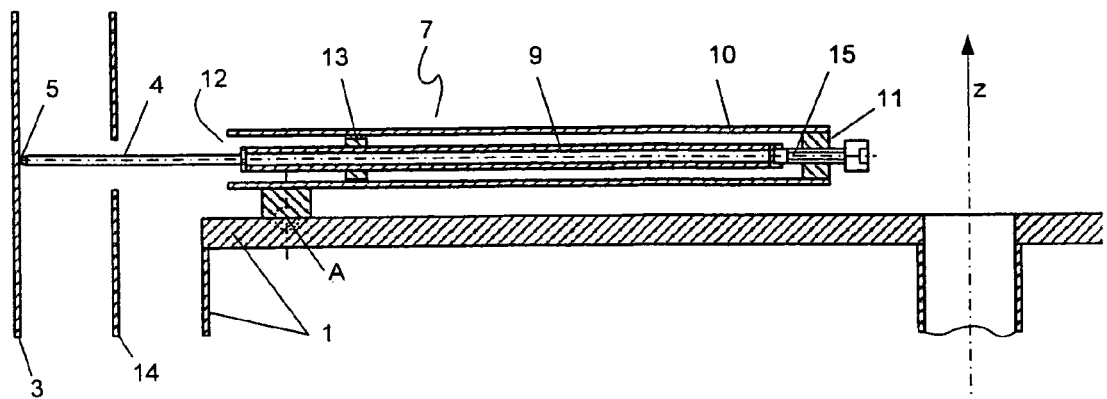
FIG. 4a shows a schematic section of one embodiment of the inventive cryostat configuration with an actuator mounted to the upper edge of a cryocontainer to be centered.

FIG. 4a shows a detailed section of the inventive cryostat configuration. The actuator 7 is connected to the cryocontainer 1 to be centered at the contact point A, e.g. by screws, and comprises substantially two components 8, 10.

There is a first central component 9 produced from a material with a small positive (e.g. carbon fiber-reinforced plastic material) or even negative thermal expansion coefficient. It is preferably designed as a tube whose length decreases only slightly or even increases during cooling.

The second component 10 is a tube which has a closed end 11 and an open end 12. It has a larger diameter than the first component 9 and the centering element 4. The second component 10 may also be a channel with rectangular cross-section. The second component 10 is made from a material with a large positive thermal expansion coefficient (such as e.g. aluminium), and is consequently greatly shortened during cooling.

A guiding sleeve 13 is disposed around the first component 9 of the actuator 7, wherein play remains between the guiding sleeve 13 and the second component 10 to enable displacement of the first component 9 relative to the second component 10 in the direction of the axis of the centering element 4, without bending the component 9. A bending load on the configuration therefore produces no inadmissibly high tension at the connecting point between the first component 9 and the second component 10.

The centering element 4 is designed as a rod which penetrates through a radiation shield 14. It is made from a material having poor thermal conducting properties, has high mechanical rigidity and at most a moderate positive thermal expansion coefficient (such as e.g. fiber glass reinforced plastic material). The rod of the centering element 4 is relatively thin so that it can also adapt, while bending, to the vertical displacement, during and after cooling, of the cryocontainer 1 relative to the outer jacket 3 on which the contact points of the centering elements 4 act. Since the centering element 4 is not only bent but also pressure-loaded like the components 9, 10 of the actuator 7, it must furthermore be dimensioned such that it does not break under the pressure load.

The first component 9 is rigidly connected to the centering element 4 e.g. glued in an aluminium sleeve. The connected elements 4, 9 are pushed into the second component 10, which is designed as a tube surrounding the first component 9, and are rigidly connected to the tube 10 at its closed end 11 e.g., using a screw connection 15. The second component 10 is rigidly screwed to the cryocontainer 1 to be supported by the centering element 4, at or close to the open tube end 12, i.e. at the contact point A in the vicinity of the outer cryocontainer edge. The free end 5 of the centering element 4 exerts pressure onto the wall of the outer jacket 3 of the cryostat configuration. The centering element 4 and the actuator 7 are mounted to the cryocontainer 1 under pretension. Towards this end, the interconnected centering element 4 and first component 9 can be horizontally displaced towards the second component 10 at the connecting location and via the screw connection 15.

Figure 4B:
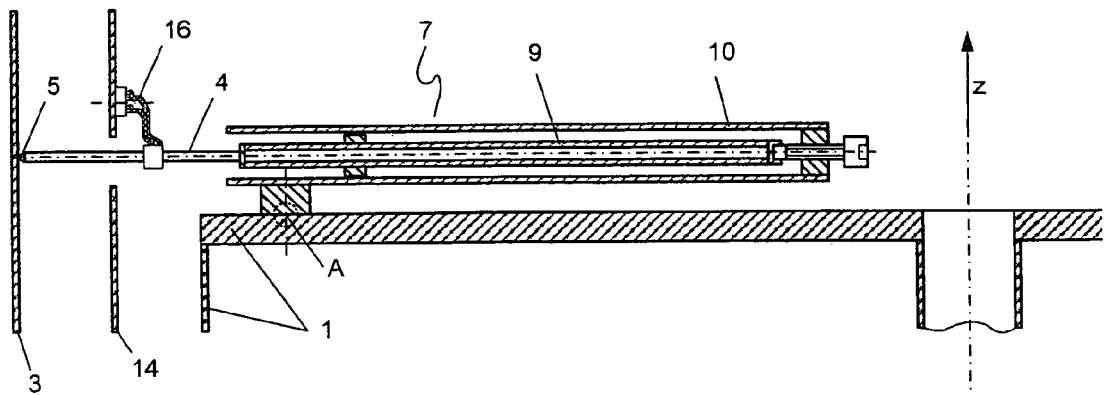
FIG. 4b shows a schematic section of one embodiment of the inventive cryostat configuration with an actuator mounted to the upper edge of a cryocontainer to be centered, and a thermal connecting element between centering element and radiation shield.

FIG. 4b shows a schematic section of an embodiment of the inventive cryostat configuration with a thermal connecting element 16 which connects the centering element 4 to the radiation shield 14. The heat input from the outer jacket 3 is at least partially absorbed by the radiation shield 14 through the thermal connecting element 16, thereby reducing the heat input into the cryocontainer 1.

The lengths and thermal expansion coefficients of the individual elements 4, 9, 10 of a pressure-loaded centering device are selected and adjusted to meet the following conditions:

the centering element 4 must be pressure-loaded, even after cooling. The reduction in length of the second component 10 causes the free end 5 of the centering element 4 to still be pressure-loaded even upon slight shortening of the centering element 4. If the geometry of the components 4, 9, 10 is not exactly matched, the centering element 4 may no longer contact the wall after cooling, or is compressed to such a large extent that it buckles, i.e. in this case, the tension state does not remain approximately constant as is required.

the heat input via thermal conduction through the centering device should be minimum. For this reason, in particular the centering element 4 should be as long and thin as possible.

the centering element 4 must moreover be able to accept the vertical displacement of the cryocontainer 1 during cooling, without breaking. Since its free end 5 is also pressed, i.e. fixed to the outer wall due to pretension and contact pressure which are larger with the asymmetrical geometry due to the pressure difference between surroundings and vacuum, it will bend more or less during cooling.

Figure 4C:
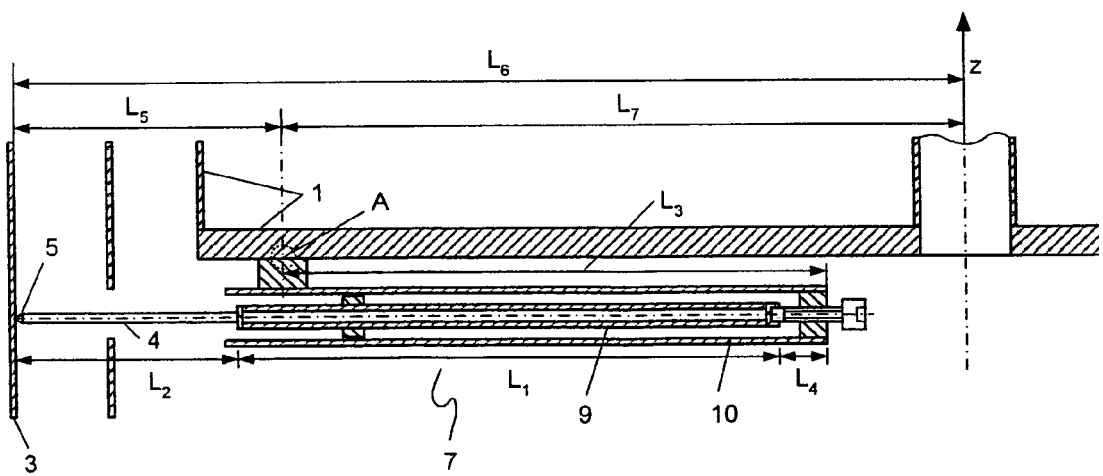
FIG. 4c shows a schematic section of an embodiment of the inventive cryostat configuration with an actuator mounted to a lower edge of a cryocontainer to be centered, and a centering element, showing individual lengths for calculating the actuator and centering element.

With reference to the embodiment shown in FIG. 4*c*, an optimum geometrical design of the centering element 4 and components 9, 10 of the actuator 7 are described in a qualitative and simplified manner to illustrate the abovementioned correlation. In the optimum case, the tip of the pressure rod (i.e. the free end 5 of the centering element 4) is supported on the wall of the outer jacket 3 before and after cooling, thereby maintaining the tensioned state.

In general, the following applies for the length change $\Delta L_i$ of an element of original length $L_{i,o}$ with a temperature change $\Delta T$:

$$\Delta L_i = \alpha_i \cdot L_{i,o} \cdot \Delta T$$

wherein $\alpha_i$ is the thermal expansion coefficient whose value depends on the temperature. It is positive for most materials such that when the temperature decreases the component shrinks ($\Delta L_i < 0$).

The length in the cold state can therefore be calculated from the length in the warm state:

$$L_i = (1 + \alpha_i \Delta T) L_{i,o}$$

In the ideal case, the partial lengths $L_2$, $L_1$ and $L_4$ must be at least as long as the sum of the partial lengths $L_3$ and $L_5$ after cooling.

$$L_2 + L_1 + L_4 \geq L_3 + L_5$$

The length $L_5$ ($\cong$ separation between the containers 1, 3) can be obtained from the shrinkage of the container 1:

$$L_5 = L_6 - L_7$$

Figure 5A:
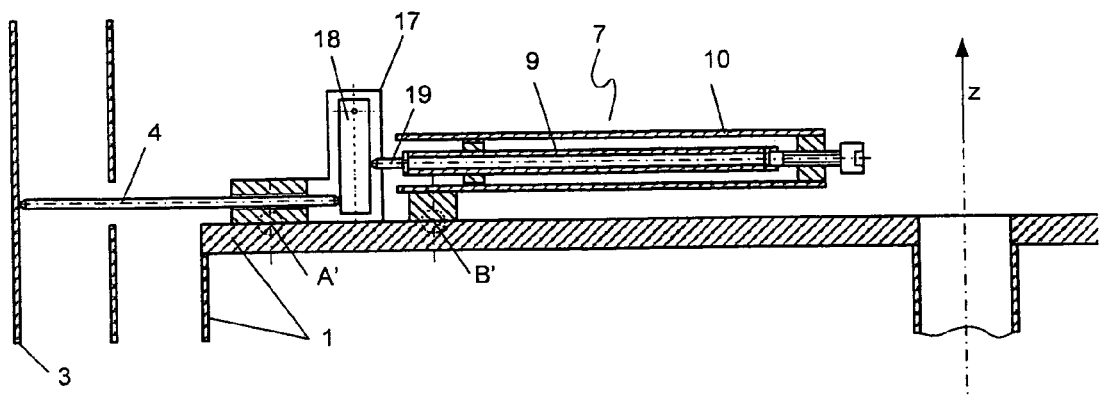
FIG. 5a shows a schematic section of an embodiment of the inventive cryostat configuration with a mechanical translating element.

FIG. 5*a* shows an embodiment which comprises, in addition to the elements 9, 10 of the actuator 7 described in FIGS. 4*a* to 4*c*, a translating element 17 in the form of a lever 18. This embodiment effects pressure compensation against the outer jacket 3 via the thermal length changes of the components 4, 9, 10 and also via a lever mechanism. The translating element 17 is connected to the cryocontainer 1 at a contact point A' close to the outer edge of the cryocontainer 1. A contact point B' between the actuator 7 and the cryocontainer 1 is close to the axis z of the cryocontainer 1 relative to the contact point A' of the translating element 17, but still close to the outer edge of the cryocontainer 1. The free end of a further rod 19 mounted to the first component 9 is connected to the short arm of the lever 18. In contrast to the above-described embodiments, the centering element 4 which extends to the wall of the outer jacket 3, is not mounted to the first component 9 but contacts the long lever arm of the translating element 17. When the cryocontainer 1 is cooled, it contracts and the contact points A', B' are displaced approximately by the same distance in the direction of the cryocontainer axis z, since they are very close to each other. This displacement can be completely compensated for through suitable selection of the materials for the individual elements 4, 9, 10, as described above. If compensation is insufficient, the motion of the first component 9 can be converted by the lever 18 into a larger deflection of the centering element 4 such that the centering element 4 is permanently loaded with nearly constant pressure, thereby compensating for position changes of the cryocontainer 1 due to temperature fluctuations.

Figure 5B:
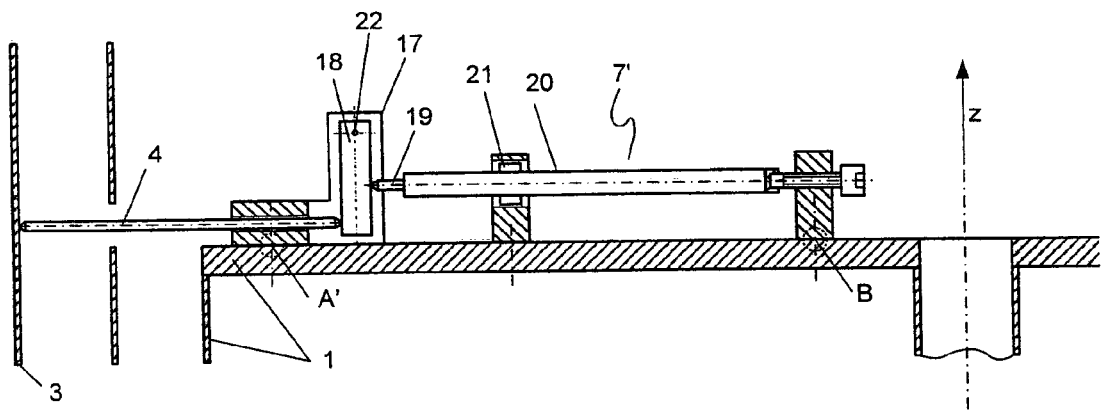
FIG. 5b shows a schematic section of an embodiment of the inventive cryostat configuration with a mechanical translating element, wherein the rod in the actuator is pressure-loaded.

FIG. 5*b* shows a section of an embodiment of the inventive cryostat configuration with an actuator 7' comprising a rod 20. The rod 20 is pressure-loaded in this embodiment, and consists of a material with negative or small positive thermal expansion coefficient. In contrast to the embodiments shown in FIGS. 4*a-c* and FIG. 5*a*, the actuator 7' is connected to the cryocontainer 1 to be centered via a connecting location at a contact point B close to the cryocontainer axis z. A guiding device 21 ensures stable position of the rod 20. The rod 20 of the actuator 7' exerts an indirect pressure on the lever 18 of the translating element 17 via the further rod 19 at the end of the actuator 7' opposite to the contact point B. Since cryocontainers generally consist of a material with positive thermal expansion coefficient, the cryocontainer 1 contracts during cooling much more at the outer edge than close to the axis z, thereby also shifting the contact point A' of the translating element 17 and therefore the point of rotation 22 of the lever 18 to the right towards the cryocontainer axis z, while the contact point B, where the rod 20 is connected to the cryocontainer 1, moves only slightly in the direction of the cryocontainer axis z. In total, the contact points move towards each other. The rod 20 approximately keeps its length and deflects the lever 18 of the translating element 17 in such a manner that the centering element 4 is always loaded with the same pressure. The separation between the contact points A' and B must be selected such that the lever 18 compensates for the length changes of the centering element 4, of the rod 20 of the actuator 7' and also the (minor) displacement of the contact point B close to the axis.

Figure 5C:
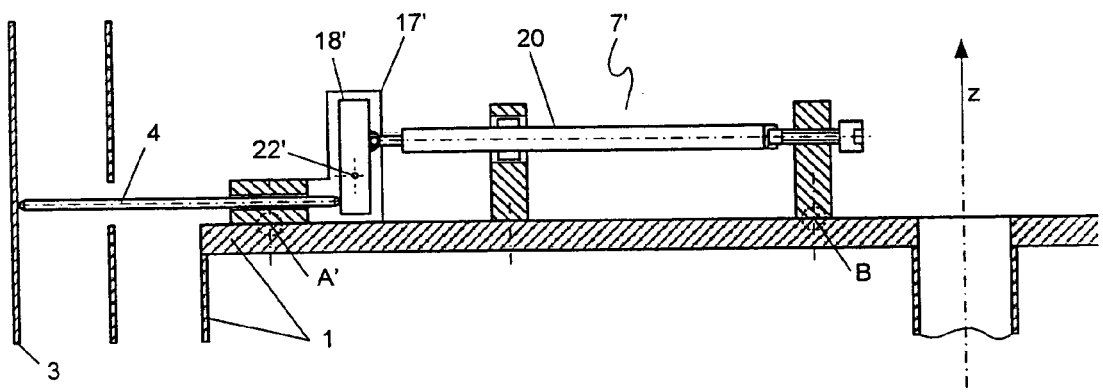
FIG. 5c shows a schematic section of an embodiment of the inventive cryostat configuration with a mechanical translating element, wherein the actuator rod is tension-loaded.

FIG. 5*c* shows a further embodiment, wherein the rod 20 of the actuator 7' is tension-loaded. In this case, the rod 20 of the actuator 7' is produced from a material with positive thermal expansion coefficient which is larger than that of the cryocontainer 1, and is mounted above the point of rotation 22' of the lever 18', whereas the centering element 4 contacts the lever 18' of the translating element 17' below the point of rotation 22'. The rod 20 of the actuator 7' is contracted to a greater extent during cooling than the cryocontainer such that the rod 20 of the actuator 7' pulls on the lever 18' of the translating element 17' and the lever 18' is deflected below the point of rotation 22' in the direction of the centering element 4. Further approximately uniform pressure load on the centering element 4 is ensured through suitable selection of the materials and geometry.

One obtains an overall cryostat configuration with pressure or tension centering, wherein one or more container/s can be centered relative to each other independently of the prevailing temperature, and the tension state in the centering element remains approximately constant.

List of Reference Numerals

1 cryocontainer
2 suspension tube
3 outer jacket
4 centering element
5 free end of the centering element
6 other end of the centering element
7 actuator
7' actuator
8 asymmetric opening 9 first component of the actuator
10 second component of the actuator
11 closed end of the second component
12 open end of the second component
13 guiding sleeve
14 radiation shield
15 axial screw connection
16 thermal connecting element
17 translating element
17' translating element
18 lever
~' lever
19 further rod
20 rod or tube
21 guiding device
22 point of rotation of the lever
22' point of rotation of the lever
A contact point between actuator and cryocontainer in the vicinity of the outer edge of the cryocontainer
A' contact point between the translating element and the cryocontainer in the vicinity of the outer edge of the cryocontainer
B contact point between the actuator and the cryocontainer in the vicinity of the axis z
B' contact point between the actuator and the cryocontainer in the vicinity of the translating element
Z axis of the cryocontainer

We claim:

1. A cryostat configuration for storing cryogenic fluids, the cryostat configuration comprising:
an outer jacket;
suspension means connected to said outer jacket, said suspension means being thermally insulating;
a cryocontainer suspended from said suspension means and disposed within said outer jacket;
at least three centering elements distributed about a periphery of said cryocontainer to center said cryocontainer relative to an container disposed further outside or relative to said outer jacket, wherein one end of each of said centering elements cooperates with said outer jacket or said container disposed further outside; and
at least three actuators, each actuator disposed between and cooperating with a second end of one of said centering elements facing away from said outer jacket or said container disposed further outside and said cryocontainer, each of said actuators mounted to said cryocontainer at a respective contact point or points, wherein each actuator exerts a tensile or compressional force on said respective centering element which is substantially independent of temperatures within the cryostat configuration.

2. The cryostat configuration of claim 1, wherein said actuators compensate for thermal changes in a size of said cryocontainer, changes in a size of individual components of said actuator, and for mechanical displacements.

3. The cryostat configuration of claim 1, wherein said tensile or compressional force remains within ±10% of a room temperature value thereof.

4. The cryostat configuration of claim 1, wherein the cryocontainer has an additional, asymmetric outward opening.

5. The cryostat configuration of claim 1, wherein at least one of said centering elements is in thermal contact, via a flexible connecting element having good thermally conducting properties, with a further cryocontainer or radiation shield disposed between said cryocontainer and a surrounding container.

6. The cryostat configuration of claim 1, wherein said centering elements are produced from fiber glass reinforced plastic material or from a material having similar thermal and mechanical properties.

7. The cryostat configuration of claim 1, wherein each centering element is formed as a tube or rod of arbitrary or variable cross-section.

8. The cryostat configuration of claim 1, wherein said actuator comprises a first and a second component, wherein said first and said second components are produced from materials having different thermal expansion coefficients.

9. The cryostat configuration of claim 8, wherein said first component of said actuator is produced from a material having a thermal expansion coefficient which is smaller than or equal to zero.

10. The cryostat configuration of claim 8, wherein said first component of said actuator is produced from a material having a positive thermal expansion coefficient whose value is selected such that, in response to a temperature change, an absolute length change of said first component is less than an absolute length change of said second component or is less than one fifth of an absolute length change of said second component.

11. The cryostat configuration of claim 8, wherein said first component of said actuator is designed as a tube or rod having an arbitrary or variable cross-section.

12. The cryostat configuration of claim 8, wherein said second component of said actuator is produced from a material having a large positive thermal expansion coefficient, from copper, brass, aluminium, or from a material having similar thermal and mechanical properties.

13. The cryostat configuration of claim 8, wherein said second component of said actuator is formed as a tube or channel which is closed at one end.

14. The cryostat configuration of claim 13, wherein said first component of said actuator is displaceably connected, via an axial screw connection, to said second component of said actuator at a closed tube or channel end of said tubular or channelled second component, wherein said first component can be displaced relative to said second component in a direction of a tube axis.

15. The cryostat configuration of claim 13, wherein said actuator second component tube or channel is rigidly connected, at or proximate to an open tube end thereof, to said cryocontainer contact point or to said contact point which is proximate to an outer edge of said cryocontainer.

16. The cryostat configuration of claim 8, wherein said first component of said actuator is disposed, or is disposed in a coaxial direction, within said second component of said actuator, wherein said second component is a tube or channel.

17. The cryostat configuration of claim 8, further comprising a guiding sleeve disposed around said first component of said actuator, said guiding sleeve being rigidly supported on said first component and having an outer diameter which is dimensioned to leave play between said guiding sleeve and said second component.

18. The cryostat configuration of claim 8, wherein said first component of said actuator is rigidly connected to said centering element at an end thereof which is not connected to said second component.

19. The cryostat configuration of claim 8, wherein said actuator further comprises a mechanical translating element, a lever, a gearwheel, or an eccentric cam member which is rigidly connected to said cryocontainer at said contact point proximate an outer edge of said cryocontainer and which contacts said first component either indirectly via a further rod or directly at an end of said first component which is not connected to said second component.

20. The cryostat configuration of claim 19, wherein said end of said first component of said actuator which is in direct or indirect contact with said mechanical translating element experiences a defined relative motion relative to said translating element, wherein said translating element translates said relative motion to said centering element such that a mechanical tension state thereof is approximately independent of instantaneous temperatures within the cryostat configuration.

21. The cryostat configuration of claim 1, wherein said actuator comprises a tube or rod with an arbitrary or a variable cross-section and having a thermal expansion coefficient which is smaller or larger than that of said cryocontainer, said actuator also comprising a mechanical translating element, a lever, a gearwheel, or an eccentric cam member.

22. The cryostat configuration of claim 21, wherein said mechanical translating element of said actuator is rigidly connected to said cryocontainer at a contact point proximate an outer edge of said cryocontainer.

23. The cryostat configuration of claim 21, wherein one end of said tube or rod of said actuator is rigidly connected to said cryocontainer at a contact point proximate an axis of said cryocontainer.

24. The cryostat configuration of claim 23, wherein said actuator tube or rod can be axially displaced via an axial screw connection disposed at an end thereof connected to said cryocontainer via said contact point and is guided in a direction of a tube axis proximate an other end thereof opposite to said screw connection via a guiding device which is rigidly connected to said cryocontainer.

25. The cryostat configuration of claim 21, wherein an end of said actuator tube or rod is in direct or indirect contact with said mechanical translating element to experience a defined motion relative to said translating element, wherein said translating element transmits said relative motion to said centering element such that a mechanical tension state thereof is approximately independent of instantaneous temperatures within the cryostat configuration.

26. The cryostat configuration of claim 1, further comprising a superconducting magnet configuration disposed within said cryocontainer.

27. The cryostat configuration of claim 26, wherein said the superconducting magnet configuration is part of an apparatus for nuclear magnetic resonance, for magnetic resonance imaging (MRI), or for magnetic resonance spectroscopy (NMR).

* * * * *